United States Patent
Watanabe

(10) Patent No.: US 11,597,851 B2
(45) Date of Patent: Mar. 7, 2023

(54) INK FOR SCREEN PRINTING

(71) Applicant: DAICEL CORPORATION, Osaka (JP)

(72) Inventor: Tsugio Watanabe, Himeji (JP)

(73) Assignee: DAICEL CORPORATION, Osaka (JP)

( * ) Notice: Subject to any disclaimer, the term of this patent is extended or adjusted under 35 U.S.C. 154(b) by 262 days.

(21) Appl. No.: 16/091,048

(22) PCT Filed: Mar. 30, 2017

(86) PCT No.: PCT/JP2017/013308
§ 371 (c)(1),
(2) Date: Oct. 3, 2018

(87) PCT Pub. No.: WO2017/175661
PCT Pub. Date: Oct. 12, 2017

(65) Prior Publication Data
US 2019/0119519 A1    Apr. 25, 2019

(30) Foreign Application Priority Data

Apr. 4, 2016   (JP) .............................. JP2016-075037

(51) Int. Cl.
| | |
|---|---|
| C09D 11/52 | (2014.01) |
| C09D 11/033 | (2014.01) |
| C09D 11/037 | (2014.01) |
| B22F 1/00 | (2022.01) |
| B41M 1/30 | (2006.01) |
| C09C 3/08 | (2006.01) |
| B82Y 30/00 | (2011.01) |
| H05K 3/12 | (2006.01) |
| B22F 1/16 | (2022.01) |
| B22F 1/102 | (2022.01) |
| B22F 7/04 | (2006.01) |
| C09D 11/08 | (2006.01) |
| H05K 1/09 | (2006.01) |

(52) U.S. Cl.
CPC .............. *C09D 11/52* (2013.01); *B22F 1/00* (2013.01); *B22F 1/102* (2022.01); *B22F 1/16* (2022.01); *B22F 7/04* (2013.01); *B41M 1/30* (2013.01); *B82Y 30/00* (2013.01); *C09C 3/08* (2013.01); *C09D 11/033* (2013.01); *C09D 11/037* (2013.01); *C09D 11/08* (2013.01); *H05K 1/097* (2013.01); *H05K 3/12* (2013.01); *H05K 3/1216* (2013.01); *H05K 3/1283* (2013.01); *B22F 2301/255* (2013.01); *B22F 2302/45* (2013.01); *H05K 2201/0224* (2013.01); *H05K 2203/1131* (2013.01)

(58) Field of Classification Search
CPC ....................................................... C09D 11/52
See application file for complete search history.

(56) References Cited

U.S. PATENT DOCUMENTS

| | | | |
|---|---|---|---|
| 9,662,748 B2 | 5/2017 | Endoh et al. | |
| 2008/0169122 A1* | 7/2008 | Shiraishi | H05K 1/095 174/257 |
| 2010/0120181 A1* | 5/2010 | Kim | B82Y 40/00 438/27 |
| 2010/0143591 A1 | 6/2010 | Wu et al. | |
| 2014/0124713 A1* | 5/2014 | Majumdar | H01L 29/45 252/513 |
| 2014/0346412 A1 | 11/2014 | Okamoto et al. | |
| 2014/0374672 A1* | 12/2014 | Chopra | C09D 11/52 252/514 |
| 2015/0028085 A1* | 1/2015 | Endoh | B22F 1/0062 228/224 |
| 2015/0037197 A1* | 2/2015 | Komatsu | B22F 3/14 419/45 |
| 2015/0083474 A1* | 3/2015 | Kawamura | C09D 11/037 174/257 |
| 2015/0224578 A1 | 8/2015 | Okamoto et al. | |

(Continued)

FOREIGN PATENT DOCUMENTS

| | | | |
|---|---|---|---|
| CN | 105142829 A | 12/2015 | |
| JP | 2001234106 | * 8/2001 | C09D 11/02 |

(Continued)

OTHER PUBLICATIONS

Magdassi S. (ed.) The Chemistry of Inkjet Inks—chapter 12 on conductive inks—2010 (Year: 2010).*
Terpienol—The Nippon Koryo Yakuhin Kaisha Ltd—2011 (Year: 2011).*
Iguchi—WO 2014-021270 A1—Google translation—WO for US appl.—published Feb. 6, 2014 (Year: 2014).*
1-Octanol _ C8H18O—PubChem (Year: 2020).*
2-(2-Ethoxyethoxy)ethyl acetate for synthesis _ 112-15-2 _ Sigma-Aldrich (Year: 2020).*
Decahydronaphthalene _ C10H18—PubChem (Year: 2020).*
Ethylene glycol monomethyl ether acetate—CAMEO (Year: 2020).*
Gamma-Terpinene _ C10H16—PubChem (Year: 2020).*

(Continued)

*Primary Examiner* — John Vincent Lawler
(74) *Attorney, Agent, or Firm* — Birch, Stewart, Kolasch & Birch, LLP

(57) ABSTRACT

Provided is an ink for use in electronic component production making use of screen printing, which is suitable for actually allowing fine lines with high precision to be drawn in screen printing, and for actually allowing successive screen printing operations to be performed. The ink for screen printing of the present invention includes surface-modified silver nanoparticles (A) and a solvent (B), and has a viscosity at a shear rate of 10 (1/s) and 25° C. of 60 Pa·s or more. The surface-modified silver nanoparticles (A) each include a silver nanoparticle and an amine-containing protective agent coating the silver nanoparticle. The solvent (B) includes at least a terpene solvent. In solvent (B), a content of solvents having a boiling point of less than 130° C. is 20 wt % or less based on the total amount of solvents.

22 Claims, No Drawings

(56) References Cited

U.S. PATENT DOCUMENTS

| | | | | |
|---|---|---|---|---|
| 2015/0225588 A1* | 8/2015 | Iguchi | ............... | H01B 1/22 |
| | | | | 106/31.92 |
| 2015/0259556 A1* | 9/2015 | Chopra | ............ | C09D 11/037 |
| | | | | 427/125 |
| 2016/0101486 A1 | 4/2016 | Endoh et al. | | |
| 2016/0160067 A1* | 6/2016 | Xia | ............... | C09D 11/10 |
| | | | | 252/503 |
| 2016/0289478 A1 | 10/2016 | Kauffmann et al. | | |

FOREIGN PATENT DOCUMENTS

| | | | | | |
|---|---|---|---|---|---|
| JP | 2003-234016 A | | 8/2003 | | |
| JP | J2005-149913 A | | 6/2005 | | |
| JP | 2009/099518 A | * | 5/2009 | ............... | B22F 1/00 |
| JP | 2009-99518 A | | 5/2009 | | |
| JP | 2010-500475 A | | 1/2010 | | |
| JP | 2010-47716 A | | 3/2010 | | |
| JP | 2010047716 | * | 3/2010 | ............ | C09D 11/02 |
| JP | 2010-150543 A | | 7/2010 | | |
| JP | 2013-142173 A | | 7/2013 | | |
| JP | 2014-34690 A1 | | 2/2014 | | |
| JP | 2014-515160 A | | 6/2014 | | |
| WO | WO 2008/018718 A1 | | 2/2008 | | |
| WO | WO 2012/135551 A1 | | 10/2012 | | |
| WO | WO 2014/021270 A1 | | 2/2014 | | |
| WO | WO 2014/024721 A1 | | 2/2014 | | |
| WO | WO-2014021270 A1 | * | 2/2014 | ............... | B22F 9/24 |
| WO | WO 2015/078819 A1 | | 6/2015 | | |
| WO | WO 2015/151941 A1 | | 10/2015 | | |

OTHER PUBLICATIONS

Tetradecane ≥99% _ Sigma-Aldrich (Year: 2020).*
Thibert—silver paste rheology on metallization—Mat.Sci.Semi. Proc.—27—2014 (Year: 2014).*
Hyun—screen printing of highly loaded silver inks—Appl.Mat. Inter.—2015 (Year: 2015).*
Saegusa—JP 2009-099518 A—IDS—MT—metal nano paste—viscosity—2009 (Year: 2009).*
Schramm—pract.appr.Rheol.Rheom.—cone-and-plate page—2000 (Year: 2000).*
Takeda—JP 2001-234106 A—MT—conductive ink 20-1000 nm—60-90% powder—2001 (Year: 2001).*
Matsuura—JP 2010-047716 A—MT—conductive ink w—15-130 Pa-s+Tl=4-10—2010 (Year: 2010).*
Faddoul 2012 Silver Content Effect on Rheology—visc-shear rate data—2012 (Year: 2012).*
International Search Report, issued in PCT/JP2017/013308, dated Jun. 20, 2017.
Written Opinion of the International Searching Authority, issued in PCT/JP2017/013308, dated Jun. 20, 2017.
Extended European Search Report dated Dec. 4, 2019, in European Patent Application No. 17779040.9.
Office Action dated Dec. 29, 2020, in Republic of Korea Patent Application No. 10-2018-7031562.
Office Action dated Feb. 16, 2021, in Japanese Patent Application No. 2018-510567.
Office Action dated Apr. 28, 2021, in Chinese Patent Application No. 201780021027.0.
Office Action dated Jan. 4, 2022, in Chinese Patent Application No. 201780021027.0.

* cited by examiner

INK FOR SCREEN PRINTING

TECHNICAL FIELD

The present invention relates to an ink for use in electronic component production making use of screen printing. The present application claims a priority based on Japanese Patent Application No. 2016-075037 filed in Japan on Apr. 4, 2016, which is incorporated herein by reference.

BACKGROUND ART

Silver nanoparticles can be sintered at a low temperature, so that the particles have been used in applications for forming electronic components such as electrodes and wirings on a plastic substrate. However, a problem is that silver nanoparticles are easily aggregated. Patent Literature 1 discloses that silver nanoparticles of which the surface is covered with an amine-containing protective agent achieve excellent dispersion stability in a solvent, and an ink including the silver nanoparticles dispersed in a solvent containing an alicyclic hydrocarbon, an alcohol or the like is suitable for use in ink jet printing.

CITATION LIST

Patent Literature

Patent Literature 1: International Publication No. WO2014/021270

SUMMARY OF INVENTION

Technical Problem

However, the ink has a viscosity that is too low for screen printing, causing difficulty in drawing fine lines with high precision due to easy spreading of the ink in screen printing. Further, in screen printing, an ink remains in a screen printing plate after printing, and in the case where the remaining ink contains a highly volatile solvent such as an alcohol, the ink is thickened or dried and fixed due to the volatilization of the solvent to cause clogging, which causes a problem of difficulty in successive screen printing operations.

Accordingly, an object of the present invention is to provide an ink for use in electronic component production making use of screen printing, which is suitable for actually allowing fine lines with high precision to be drawn in screen printing, and for actually allowing successive screen printing operations to be performed.

Another object of the present invention is to provide an ink for use in electronic component production making use of screen printing, which is suitable for actually allowing fine lines with high precision to be drawn in screen printing, for actually allowing successive screen printing operations to be performed, and for forming electronic components excellent in adhesion to a substrate.

Another object of the present invention is to provide a method for producing an electronic device using the ink.

Another object of the present invention is to provide an electronic device including a sintered body of the ink.

Solution to Problems

Through extensive study to solve the problem, the present inventor has found that an ink having a specific viscosity, obtained by dispersing silver nanoparticles each configured to have a surface coated with an amine-containing protective agent in a specific solvent which includes at least a terpene solvent and in which a content of solvents having a boiling point of less than 130° C. is 20 wt % or less, allows fine lines to be precisely drawn in screen printing, and found that since the volatility of the ink at the screen printing temperature is extremely low, clogging of the screen printing plate due to the ink is suppressed in screen printing to allow successive screen printing operations to be performed. The present invention has been made based on these findings.

In the present specification, the term "nanoparticles", refers to particles having a size of primary particles (average primary particle diameter) of less than 1000 nm. The particle diameter is determined by scanning electron microscope (SEM) observation. In the present specification, a boiling point is the value under normal pressure (760 mmHg).

The present invention provides, in an aspect, an ink for screen printing. The ink includes surface-modified silver nanoparticles (A) and a solvent (B), and has a viscosity of 60 Pa·s or more at 25° C. and a shear rate of 10 (1/s). The surface-modified silver nanoparticles (A) each include a silver nanoparticle and an amine-containing protective agent coating the silver nanoparticle. The solvent (B) includes at least a terpene solvent. In the solvent (B), a content of solvents having a boiling point of less than 130° C. is 20 wt % or less based on the total amount of solvent.

In the ink for screen printing according to the present invention, the protective agent may include, as the amines, an aliphatic monoamine (1) containing 6 or more carbon atoms in total, and at least one of an aliphatic monoamine (2) containing 5 or less carbon atoms in total and an aliphatic diamine (3) containing 8 or less carbon atoms in total.

The aliphatic monoamine (1) containing 6 or more carbon atoms in total may be a monoamine containing 6 to 18 carbon atoms in total and having a straight-chain alkyl group, and/or a monoamine containing 6 to 16 carbon atoms in total and having a branched-chain alkyl group.

The aliphatic monoamine (2) containing 5 or less carbon atoms in total may be a monoamine containing 2 to 5 carbon atoms in total and having a straight-chain or branched-chain alkyl group.

The aliphatic diamine (3) containing 8 or less carbon atoms in total may be a diamine containing 1 to 8 carbon atoms in total and represented by the following formula (a-2):

[Formula 1]

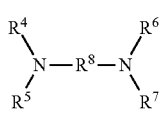

(a-2)

wherein $R^4$ and $R^5$ are the same or different, and are each a straight-chain or branched-chain alkyl group; $R^6$ and $R^7$ are each a hydrogen atom; and $R^8$ is a straight-chain or branched-chain alkylene group.

In the ink for screen printing according to the present invention, the terpene solvent may have a boiling point of 130° C. or more and a viscosity at 20° C. of 50 to 250 mPa·s.

The solvent (B) may further include a glycol ether solvent having a boiling point of 130° C. or more.

The glycol ether solvent may include a compound represented by the following formula (b):

$$R^{11}—(O—R^{13})_m—OR^{12} \qquad (b)$$

wherein $R^{11}$ and $R^{12}$ are the same or different, and each represent an alkyl group or an acyl group; $R^{13}$ represents an alkylene group containing 1 to 6 carbon atoms; and m represents an integer of 1 or more.

The ink for screen printing according to the present invention may further include a binder resin (C).

The ink for screen printing according to the present invention may, when sintered at 120° C. for 30 minutes, form a sintered body having a volume resistivity of 10 μΩcm or less.

The present invention provides, in another aspect, a method for producing an electronic device. The method includes the steps of applying the ink for screen printing on a substrate by screen printing, and sintering the ink on the substrate.

The present invention provides, in yet another aspect, an electronic device. The electronic device includes a substrate and a sintered body of the ink for screen printing disposed on the substrate.

Specifically, the present invention relates to the followings:

[1] An ink for screen printing, including surface-modified silver nanoparticles (A) and a solvent (B), and having a viscosity at a shear rate of 10 (1/s) and 25° C. of 60 Pas or more, preferably 70 Pas or more, more preferably 80 Pas or more, further preferably 90 Pas or more, further preferably 100 Pas or more, and particularly preferably 150 Pas or more, with an upper limit of the viscosity of preferably 500 Pa·s, more preferably 450 Pa·s, particularly preferably 400 Pa·s, and most preferably 350 Pa·s, wherein the surface-modified silver nanoparticles (A) each include a silver nanoparticle and an amine-containing protective agent coating the silver nanoparticle, the solvent (B) includes at least a terpene solvent, and, in the solvent (B), a content of solvents having a boiling point of less than 130° C. is 20 wt % or less, preferably 10 wt % or less, particularly preferably 5 wt % or less, and most preferably 1 wt % or less based on the total amount of solvents.

[2] The ink for screen printing according to [1], wherein the protective agent includes, as the amines, an aliphatic monoamine (1) containing 6 or more carbon atoms in total, and at least one of an aliphatic monoamine (2) containing 5 or less carbon atoms in total and an aliphatic diamine (3) containing 8 or less carbon atoms in total.

[3] The ink for screen printing according to [2], wherein the aliphatic monoamine (1) containing 6 or more carbon atoms in total is a monoamine containing 6 to 18 carbon atoms in total and having a straight-chain alkyl group, and/or a monoamine containing 6 to 16 carbon atoms in total and having a branched-chain alkyl group.

[4] The ink for screen printing according to [2], wherein the aliphatic monoamine (1) containing 6 or more carbon atoms in total is a primary amine having a straight-chain or branched-chain alkyl group.

[5] The ink for screen printing according to [2], wherein the aliphatic monoamine (1) containing 6 or more carbon atoms in total is at least one compound selected from the group consisting of hexylamine, heptylamine, octylamine, nonylamine, decylamine, undecylamine, dodecylamine, tridecylamine, tetradecylamine, pentadecylamine, hexadecylamine, heptadecylamine, octadecylamine, isohexylamine, 2-ethylhexylamine, and tert-octylamine.

[6] The ink for screen printing according to any one of [2] to [5], wherein the aliphatic monoamine (2) containing 5 or less carbon atoms in total is a primary amine having a straight-chain or branched-chain alkyl group, and containing 2 to 5 carbon atoms in total, and preferably 4 to 5 carbon atoms in total.

[7] The ink for screen printing according to any one of [2] to [5], wherein the aliphatic monoamine (2) containing 5 or less carbon atoms in total is a primary amine having a straight-chain alkyl group and containing 2 to 5 carbon atoms in total, and preferably 4 to 5 carbon atoms in total.

[8] The ink for screen printing according to any one of [2] to [5], wherein the aliphatic monoamine (2) containing 5 or less carbon atoms in total is at least one compound selected from the group consisting of n-butylamine, isobutylamine, sec-butylamine, tert-butylamine, pentylamine, isopentyl amine, and tert-pentylamine.

[9] The ink for screen printing according to any one of [2] to [8], wherein the aliphatic monoamine (2) containing 5 or less carbon atoms in total is a monoamine containing 2 to 5 carbon atoms in total and having a straight-chain or branched-chain alkyl group.

[10] The ink for screen printing according to any one of [2] to [9], wherein the aliphatic diamine (3) containing 8 or less carbon atoms in total is a diamine containing 1 to 8 carbon atoms in total and represented by the formula (a-2).

[11] The ink for screen printing according to any one of [2] to [9], wherein the aliphatic diamine (3) containing 8 or less carbon atoms in total is a diamine represented by the formula (a-2), wherein $R^4$ and $R^5$ are the same or different, and are each a straight-chain or branched-chain alkyl group; $R^6$ and $R^7$ are each a hydrogen atom; and $R^8$ is a straight-chain or branched-chain alkylene group.

[12] The ink for screen printing according to any one of [2] to [9], wherein the aliphatic diamine (3) containing 8 or less carbon atoms in total is a diamine represented by the formula (a-2), wherein $R^4$ and $R^5$ are each a straight-chain alkyl group, $R^6$ and $R^7$ are each a hydrogen atom, and $R^8$ is a straight-chain alkylene group.

[13] The ink for screen printing according to any one of [2] to [12], wherein a content of the monoamine (1) is 5 to 65 mol %, with a lower limit of preferably 10 mol %, and particularly preferably 15 mol %, and with an upper limit of preferably 50 mol %, particularly preferably 40 mol %, and most preferably 35 mol %; and a content of the monoamine (2) is 35 to 95 mol %, with a lower limit of preferably 50 mol %, particularly preferably 60 mol %, and most preferably 65 mol %, and with an upper limit of preferably 90 mol %, and particularly preferably 85 mol %; relative to the total amount of amines covering a surface of silver nanoparticles in the surface-modified silver nanoparticles.

[14] The ink for screen printing according to any one of [2] to [13], wherein the ratio of the total content of the monoamine (1), the monoamine (2) and the diamine (3) to the total amount of the amines covering a surface of silver nanoparticles in the surface-modified silver nanoparticles (A) is 60 wt % or more, preferably 80 wt % or more, and particularly preferably 90 wt % or more.

[15] The ink for screen printing according to any one of [1] to [14], wherein the terpene solvent has a boiling point of 130° C. or more and a viscosity at 20° C. of 50 to 250 mPa·s.

[16] The ink for screen printing according to any one of [1] to [15], wherein the solvent (B) further includes a glycol ether solvent having a boiling point of 130° C. or more.

[17] The ink for screen printing according to [16], wherein the glycol ether solvent includes a compound represented by the following formula (b):

wherein $R^{11}$ and $R^{12}$ are the same or different, and each represent an alkyl group or an acyl group; $R^{13}$ represents an alkylene group containing 1 to 6 carbon atoms; and m represents an integer of 1 or more.

[18] The ink for screen printing according to [16], wherein the glycol ether solvent includes a compound represented by the following formula (b'):

wherein $R^{14}$ represents an alkyl group or an aryl group; $R^{15}$ represents an alkylene group containing 1 to 6 carbon atoms; and n represents an integer of 1 or more.

[19] The ink for screen printing according to [16], wherein the glycol ether solvent includes:
a compound represented by the following formula (b):

wherein $R^{11}$ and $R^{12}$ are the same or different, and each represent an alkyl group or an acyl group; $R^{13}$ represents an alkylene group containing 1 to 6 carbon atoms; and m represents an integer of 1 or more; and/or
a compound represented by the following formula (b'):

wherein $R^{14}$ represents an alkyl group or an aryl group; $R^{15}$ represents an alkylene group containing 1 to 6 carbon atoms; and n represents an integer of 1 or more.

[20] The ink for screen printing according to one of [17] and [19], wherein the compound represented by the formula (b) has a boiling point of 130° C. or more, preferably 170° C. or more, and particularly preferably 200° C. or more.

[21] The ink for screen printing according to one of [17] and [19], wherein the compound represented by the formula (b) has a boiling point of 130 to 300° C., preferably 170 to 300° C., and particularly preferably 200 to 300° C.

[22] The ink for screen printing according to any one of [17], and [19] to [21], wherein the compound represented by the formula (b) is at least one compound selected from the group consisting of a glycol diether, a glycol ether acetate, and a glycol diacetate.

[23] The ink for screen printing according to any one of [17], and [19] to [21], wherein the compound represented by the formula (b) is at least one compound selected from the group consisting of 1,3-butylene glycol diacetate, 1,4-butanediol diacetate, 1,6-hexanediol diacetate, diethylene glycol dibutyl ether, diethylene glycol methyl-n-butyl ether, diethylene glycol-n-butyl ether acetate, diethylene glycol ethyl ether acetate, diethylene glycol butyl ether acetate, dipropylene glycol methyl-isopentyl ether, dipropylene glycol methyl-n-propyl ether, dipropylene glycol methyl-n-butyl ether, dipropylene glycol methyl cyclopentyl ether, triethylene glycol dimethyl ether, triethylene glycol methyl-n-butyl ether, tripropylene glycol methyl-n-propyl ether, tripropylene glycol dimethyl ether, and tetraethylene glycol dimethyl ether.

[24] The ink for screen printing according to any one of [18] to [23], wherein the compound represented by the formula (b') has a boiling point of 130° C. or more, and preferably 140° C. or more.

[25] The ink for screen printing according to any one of [18] to [23], wherein the compound represented by the formula (b') has a boiling point of 130 to 310° C., preferably 130 to 250° C., particularly preferably 130 to 200° C., most preferably 130 to 180° C., and especially preferably 140 to 180° C.

[26] The ink for screen printing according to any one of [18] to [25], wherein the compound represented by the formula (b') is at least one compound selected from the group consisting of ethylene glycol monomethyl ether, ethylene glycol monoisopropyl ether, ethylene glycol monobutyl ether, ethylene glycol monoisobutyl ether, ethylene glycol mono-t-butyl ether, ethylene glycol monohexyl ether, ethylene glycol mono-2-ethylhexyl ether, ethylene glycol monophenyl ether, ethylene glycol monobenzyl ether, diethylene glycol monomethyl ether, diethylene glycol monobutyl ether, diethylene glycol monoisobutyl ether, diethylene glycol monoisopropyl ether, diethylene glycol monopentyl ether, diethylene glycol monoisopentyl ether, diethylene glycol monohexyl ether, diethylene glycol mono-2-ethylhexyl ether, diethylene glycol monophenyl ether, diethylene glycol monobenzyl ether, triethylene glycol monomethyl ether, triethylene glycol monobutyl ether, propylene glycol monoethyl ether, propylene glycol monopropyl ether, propylene glycol monobutyl ether, dipropylene glycol monomethyl ether, and 3-methoxy-1-butanol.

[27] The ink for screen printing according to any one of [18] to [25], wherein the compound represented by the formula (b') is at least one compound selected from the group consisting of ethylene glycol monoisopropyl ether, ethylene glycol monobutyl ether, ethylene glycol monoisobutyl ether, ethylene glycol mono-t-butyl ether, diethylene glycol monomethyl ether, diethylene glycol monopentyl ether, diethylene glycol monoisopentyl ether, diethylene glycol monohexyl ether, propylene glycol monoethyl ether, propylene glycol monopropyl ether, propylene glycol monobutyl ether, dipropylene glycol monomethyl ether, and 3-methoxy-1-butanol.

[28] The ink for screen printing according to any one of [18] to [25], wherein the compound represented by the formula (b') is at least one compound selected from the group consisting of ethylene glycol monoisopropyl ether, ethylene glycol monobutyl ether, ethylene glycol monoisobutyl ether, ethylene glycol mono-t-butyl ether, diethylene glycol monopentyl ether, diethylene glycol monoisopentyl ether, diethylene glycol monohexyl ether, propylene glycol monoethyl ether, propylene glycol monopropyl ether, propylene glycol monobutyl ether, dipropylene glycol monomethyl ether, and 3-methoxy-1-butanol.

[29] The ink for screen printing according to any one of [1] to [28], further including a binder resin (C).

[30] The ink for screen printing according to any one of [1] to [29], wherein a content of the surface-modified silver nanoparticles is 60 to 85 wt %, and preferably 70 to 85 wt % based on to the total amount of the ink for screen printing (100 wt %).

[31] The ink for screen printing according to any one of [1] to [29], wherein a content of the surface-modified silver nanoparticles is 60 to 85 wt %, preferably 60 to 80 wt %, and particularly preferably 60 to 75 wt % based on the total amount of the ink for screen printing (100 wt %).

[32] The ink for screen printing according to any one of [1] to [31], wherein a content of the terpene solvent is 5 to 30 wt %, with a lower limit of preferably 10 wt %, and particularly preferably 14 wt %, and with an upper limit of preferably 25 wt %, and particularly preferably 18 wt % based on the total amount of the ink for screen printing (100 wt %).

[33] The ink for screen printing according to any one of [17], and [19] to [32], wherein a content of the compound represented by the formula (b) is 0.5 to 5 wt %, with a lower limit of preferably 1.6 wt % and with an upper limit of preferably 3 wt %, and particularly preferably 2 wt % based on the total amount of the ink for screen printing (100 wt %). [34] The ink for screen printing according to any one of [18] to [32], wherein a content of the compound represented by the formula (b') is 5 to 10 wt %, and preferably 5 to 8.5 wt % based on the total amount of the ink for screen printing (100 wt %).

[35] The ink for screen printing according to any one of [1] to [34], wherein the ink has a viscosity at a shear rate of 100 (1/s) and 25° C. of 10 to 100 Pa·s, with an upper limit of preferably 80 Pa·s, particularly preferably 60 Pa·s, most preferably 50 Pa·s, and especially preferably 40 Pa·s, and with a lower limit of preferably 15 Pa·s, particularly preferably 20 Pa·s, most preferably 25 Pa·s, and especially preferably 30 Pa·s.

[36] The ink for screen printing according to any one of [1] to [35], wherein the ink has a TI value (viscosity at a shear rate of 10 (1/s)/viscosity at a shear rate of 100 (1/s)) at 25° C. is 3.0 to 10.0, preferably 3.5 to 7.0, particularly preferably 4.0 to 6.5, most preferably 4.5 to 6.3, and especially preferably 4.8 to 6.2. [37] The ink for screen printing according to any one of [1] to [36], wherein a sintered body obtained by sintering the ink at 120° C. for 30 minutes has a volume resistivity of 10 μΩ cm or less, preferably 8 μΩcm or less, and particularly preferably 6 μΩcm or less.

[38] A method for producing an electronic device including the steps of applying the ink for screen printing according to any one of [1] to [37] on a substrate by screen printing, and sintering the ink.

[39] An electronic device including a substrate and a sintered body of the ink for screen printing according to any one of [1] to [37] disposed on the substrate.

Advantageous Effects of Invention

The ink of the present invention has the configuration described above, so that use of the ink allows fine lines to be precisely drawn in screen printing. Further, due to extremely low volatility of the ink at the printing temperature, a screen plate is prevented from clogging, so that successive screen printing operations (for example, printing repeated 40 or more times successively) can be performed. Further, the ink of the present invention can be applied and then sintered to make a sintered body having an excellent conductivity (even in low temperature sintering). Consequently, the ink of the present invention can be suitably used in applications for producing electronic components such as electrodes and wirings on a plastic substrate by screen printing.

DESCRIPTION OF EMBODIMENTS

Ink for Screen Printing

The ink for screen printing of the present invention includes surface-modified silver nanoparticles (A) and a solvent (B), and has a viscosity of 60 Pa·s or more at 25° C. and a shear rate of 10 (1/s). Surface-modified silver nanoparticles (A) each have a silver nanoparticle and an amine-containing protective agent coating the silver nanoparticle. Solvent (B) includes at least a terpene solvent. In the solvent (B), a content of solvents having a boiling point of less than 130° C. is 20 wt % or less based on the total amount of solvents.

Surface-Modified Silver Nanoparticles (A)

The surface-modified silver nanoparticles of the present invention each have a configuration in which a surface of the silver nanoparticle is coated with an amine-containing protective agent, more specifically, a configuration in which a surface of the silver nanoparticle is electrically coordinated with unshared electron pair or pairs of an amine or amines. The ink for screen printing of the present invention contains surface-modified silver nanoparticles as conductive material, so that excellent dispersion stability of the silver nanoparticles can be achieved.

The silver nanoparticles of the surface-modified silver nanoparticles according to the present invention has an average primary particle diameter of, for example, 0.5 to 100 nm, preferably 0.5 to 80 nm, more preferably 1 to 70 nm, and still more preferably 1 to 60 nm.

Solvent (B)

A solvent (B) of the present invention includes at least a terpene solvent. In the solvent (B), a content of solvents having a boiling point of less than 130° C. is 20 wt % or less based on the total amount of solvents. Since the ink for screen printing of the present invention contains the solvent (B), a screen plate is prevented from clogging caused by volatilization of solvent, so that successive screening printing operations can be performed.

Preferably, the terpene solvent has a boiling point of 130° C. or more (for example, 130 to 300° C., and preferably 200 to 300° C.)

The terpene solvent for use has a viscosity at 20° C. of, for example, 50 to 250 mPa·s, particularly preferably 100 to 250 mPa·s, and most preferably 150 to 250 mPa·s, from the viewpoint of the fact that the prepared ink for screen printing can have appropriately high viscosity to draw fine lines with excellent precision. Note that the viscosity of the solvent is a value measured at 20° C. and at a shear rate of 20 (1/s) with a rheometer (trade name: "Physica MCR301", manufactured by Anton Paar GmbH).

Examples of the terpene solvent include 4-(1'-acetoxy-1'-methyl ester)-cyclohexanol acetate, 1,2,5,6-tetrahydrobenzyl alcohol, 1,2,5,6-tetrahydrobenzyl acetate, cyclohexyl acetate, 2-methylcyclohexyl acetate, 4-t-butylcyclohexyl acetate, terpineol, dihydroterpineol, dihydroterpinyl acetate, α-terpineol, β-terpineol, γ-terpineol, L-α-terpineol, dihydroterpinyl oxyethanol, terpinyl methyl ether, and dihydroterpinyl methyl ether. These may be used singly or in combination of two or more. In the present invention, commercially available products under the following trade names such as "TERUSOLVE MTPH", "TERUSOLVE IPG", "TERUSOLVE IPG-Ac", "TERUSOLVE IPG-2Ac", "TERPINEOL C" (mixture of α-terpineol, β-terpineol, and γ-terpineol, boiling point: 218° C., viscosity: 54 mPa·s), "TERUSOLVE DTO-210", "TERUSOLVE THA-90", "TERUSOLVE THA-70" (boiling point: 223° C., viscosity: 198 mPa·s), and "TERUSOLVE TOE-100", manufactured by Nippon Terpene Chemicals Inc., may be used.

The solvent (B) of the present invention may contain one or a plurality of solvents other than the terpene solvent. Examples of the other solvent include glycol ether solvents having a boiling point of 130° C. or more.

Examples of the glycol ether solvent include compounds represented by the following formula (b):

$$R^{11}-(O-R^{13})_m-OR^{12} \qquad (b)$$

wherein $R^{11}$ and $R^{12}$ are the same or different, and each represent an alkyl group or an acyl group; $R^{13}$ represents an alkylene group containing 1 to 6 carbon atoms; and m represents an integer of 1 or more.

Examples of the alkyl group as $R^{11}$ or $R^{12}$ include a straight-chain or branched-chain alkyl group containing 1 to 10, and preferably 1 to 5, carbon atoms.

Examples of the acyl group (RCO— group) as $R^{11}$ or $R^{12}$ include an acyl group with the R of a straight-chain or branched-chain alkyl group containing 1 to 10 (preferably 1 to 5) carbon atoms, such as an acetyl group, a propionyl group, a butyryl group, an isobutyryl group, and a pivaloyl group.

As the compound represented by the formula (b) for use in the present invention, in particular, a compound having $R^{11}$ and $R^{12}$ in formula (b) which are different from each other (alkyl groups different from each other, acyl groups different from each other, or an alkyl group and an acyl group) is preferred; a compound having $R^{11}$ and $R^{12}$ in formula (b) which are alkyl groups different from each other is particularly preferred; and a compound having a straight-chain or branched-chain alkyl group containing 4 to 10 (preferably 4 to 6) carbon atoms, and a straight-chain or branched-chain alkyl group containing 1 to 3 carbon atoms in combination as $R^{11}$ and $R^{12}$ is most preferred.

Examples of the alkylene group as $R^{13}$ include a methylene group, a methylmethylene group, a dimethylmethylene group, an ethylene group, a propylene group, a trimethylene group, a tetramethylene group, a pentamethylene group, and a hexamethylene group. Among them, an alkylene group containing 1 to 4 carbon atoms is preferred, an alkylene group containing 1 to 3 carbon atoms is particularly preferred, and an alkylene group containing 2 to 3 carbon atoms is most preferred in the present invention.

Hereupon, m is an integer of 1 or more, for example, an integer of 1 to 8, preferably an integer of 1 to 3, and particularly preferably an integer of 2 to 3.

The boiling point of the compound represented by the formula (b) is, for example, 130° C. or more (e.g. 130 to 300° C.), preferably 170° C. or more, and particularly preferably 200° C. or more.

Examples of the compound represented by the formula (b) include glycol diethers, glycol ether acetates, and glycol diacetates such as ethylene glycol methyl ether acetate (boiling point: 145° C.), ethylene glycol-n-butyl ether acetate (boiling point: 188° C.), propylene glycol methyl-n-propyl ether (boiling point: 131° C.), propylene glycol methyl-n-butyl ether (boiling point: 155° C.), propylene glycol methyl isoamyl ether (boiling point: 176° C.), propylene glycol diacetate (boiling point: 190° C.), propylene glycol methyl ether acetate (boiling point: 146° C.), 3-methoxybutyl acetate (boiling point: 171° C.), 1,3-butylene glycol diacetate (boiling point: 232° C.), 1,4-butanediol diacetate (boiling point: 232° C.), 1,6-hexane diol diacetate (boiling point: 260° C.), diethylene glycol dimethyl ether (boiling point: 162° C.), diethylene glycol diethyl ether (boiling point: 189° C.), diethylene glycol dibutyl ether (boiling point: 256° C.), diethylene glycol ethyl methyl ether (boiling point: 176° C.), diethylene glycol isopropyl methyl ether (boiling point: 179° C.), diethylene glycol methyl-n-butyl ether (boiling point: 212° C.), diethylene glycol-n-butyl ether acetate (boiling point: 247° C.), diethylene glycol ethyl ether acetate (boiling point: 218° C.), diethylene glycol butyl ether acetate (boiling point: 246.8° C.), dipropylene glycol methyl-isopentyl ether (boiling point: 227° C.), dipropylene glycol dimethyl ether (boiling point: 175° C.), dipropylene glycol methyl-n-propyl ether (boiling point: 203° C.), dipropylene glycol methyl-n-butyl ether (boiling point: 216° C.), dipropylene glycol methyl cyclopentyl ether (boiling point: 286° C.), dipropylene glycol methyl acetate (boiling point: 195° C.), triethylene glycol dimethyl ether (boiling point: 216° C.), triethylene glycol methyl-n-butyl ether (boiling point: 261° C.), tripropylene glycol methyl-n-propyl ether (boiling point: 258° C.), tripropylene glycol dimethyl ether (boiling point: 215° C.), and tetraethylene glycol dimethyl ether (boiling point: 275° C.). These may be used singly or in combination of two or more.

The glycol ether solvent may further include a compound (glycol monoether) represented by the following formula (b'):

$$R^{14}—(O—R^{15})_n—OH \tag{b'}$$

wherein $R^{14}$ represents an alkyl group or an aryl group; $R^{15}$ represents an alkylene group containing 1 to 6 carbon atoms; and n represents an integer of 1 or more.

Examples of the alkyl group as $R^{14}$ include a straight-chain or branched-chain alkyl group containing 1 to 10 (preferably 1 to 5) carbon atoms. Examples of the aryl group include an aryl group containing 6 to 10 carbon atoms (e.g., phenyl group).

Examples of the alkylene group as $R^{15}$ include a straight-chain or branched-chain alkylene group such as a methylene group, a methylmethylene group, a dimethylmethylene group, an ethylene group, a propylene group, a trimethylene group, a tetramethylene group, a pentamethylene group, and a hexamethylene groups. Among them, an alkylene group containing 1 to 4 carbon atoms is preferred, an alkylene group containing 1 to 3 carbon atoms is particularly preferred, and an alkylene group containing 2 to 3 carbon atoms is most preferred in the present invention.

Hereupon, n is an integer of 1 or more, for example, an integer of 1 to 8, preferably an integer of 1 to 3, and particularly preferably an integer of 2 to 3.

The boiling point of the compound represented by the formula (b') is, for example, 130° C. or more (e.g. 130 to 310° C.), preferably 130 to 250° C., particularly preferably 130 to 200° C., most preferably 130 to 180° C., and especially preferably 140 to 180° C.

Examples of the compound represented by the formula (b') include ethylene glycol monomethyl ether (boiling point: 124° C.), ethylene glycol monoisopropyl ether (boiling point: 141.8° C.), ethylene glycol monobutyl ether (boiling point: 171.2° C.), ethylene glycol monoisobutyl ether (boiling point: 160.5° C.), ethylene glycol mono-t-butyl ether (boiling point: 152° C.), ethylene glycol monohexyl ether (boiling point: 208° C.), ethylene glycol mono-2-ethylhexyl ether (boiling point: 229° C.), ethylene glycol monophenyl ether (boiling point: 244.7° C.), ethylene glycol monobenzyl ether (boiling point: 256° C.), diethylene glycol monomethyl ether (boiling point: 194° C.), diethylene glycol monobutyl ether (i.e., butyl carbitol, boiling point: 230° C.), diethylene glycol monoisobutyl ether (boiling point: 220° C.), diethylene glycol monoisopropyl ether (boiling point: 207° C.), diethylene glycol monopentyl ether (boiling point: 162° C.), diethylene glycol monoisopentyl ether, diethylene glycol monohexyl ether (i.e., hexyl carbitol, boiling point: 259.1° C.), diethylene glycol mono-2-ethylhexyl ether (boiling point: 272° C.), diethylene glycol monophenyl ether (boiling point: 283° C.), diethylene glycol monobenzyl ether (boiling point: 302° C.), triethylene glycol monomethyl ether (boiling point: 249° C.), triethylene glycol monobutyl ether (boiling point: 271.2° C.), propylene glycol monoethyl ether (boiling point: 132.8° C.), propylene glycol monopropyl ether (boiling point: 149° C.), propylene glycol monobutyl ether (boiling point: 170° C.), dipropylene glycol monomethyl ether (boiling point: 188° C.), and 3-methoxy-1-butanol (boiling point: 158° C.). These may be used singly or in combination of two or more.

As the solvent having a boiling point of 130° C. or more, the ink for screen printing of the present invention may contain one or a plurality of solvents other than the compounds represented by the formula (b) or the formula (b') (e.g., ethyl lactate acetate (boiling point: 181° C.), tetrahydrofurfuryl acetate (boiling point: 195° C.), tetrahydrofurfuryl alcohol (boiling point: 176° C.), ethylene glycol (boiling point: 197° C.), etc.). The content of the other solvents having a boiling point of 130° C. or more, however, is 30 wt % or less, preferably 20 wt % or less, particularly preferably 15 wt % or less, most preferably 10 wt % or less, further more preferably 5 wt % or less, and especially preferably 1 wt % or less, relative to the total amount of the solvents contained in the ink for screen printing of the present invention.

Other Components

The ink for screen printing of the present invention may contain additives such as a binder resin, a surface energy modifier, a plasticizer, a leveling agent, an antifoaming agent and a tackifier, in addition to the components described above on an as needed basis. In particular, the ink for screen printing of the present invention preferably contains a binder resin (C) from the viewpoint of the effect on improvement in the adhesion to a substrate and the flexibility of a sintered body obtained by applying the ink for screen printing of the present invention on the substrate (or printing the ink) and then sintering the applied ink.

Examples of the binder resin (C) include a vinyl chloride-vinyl acetate copolymer resin, a polyvinyl butyral resin, a polyester resin, an acrylic resin, and a cellulose resin. These may be used singly or in combination of two or more. As the binder resin (C) for use in the present invention, a cellulose resin is preferred, and, for example, commercially available products with trade names "ETHOCEL std. 200", and "ETHOCEL std. 300" (manufactured by The Dow Chemical Company) may be employed.

The content of the binder resin (C) (e.g., cellulose resin) is, for example, about 0.5 to 5.0 wt %, and preferably 1.0 to 3.0 wt %, relative to the total amount of the ink for screen printing.

Method for Producing Ink for Screen Printing

The ink for screen printing of the present invention can be produced, for example, as follows. Through the steps of mixing a silver compound and an amine-containing protective agent to form a complex containing the silver compound and the amine (complex formation step), thermally decomposing the complex (thermal decomposition step), and cleaning a reaction product on an as needed basis (cleaning step), surface-modified silver nanoparticles (A) are produced. Through the step of mixing the resulting surface-modified silver nanoparticles (A) and a solvent (B) containing at least a terpene solvent (ink preparation step), the ink for screen printing is produced.

Complex Formation Step

Preferably, a compound which is easily decomposed by heating to form metallic silver is used as the silver compound. Examples of the silver compound include a silver carboxylate such as silver formate, silver acetate, silver oxalate, silver malonate, silver benzoate and silver phthalate; a silver halide such as silver fluoride, silver chloride, silver bromide and silver iodide; silver sulfate; silver nitrate; and silver carbonate. Among them, silver oxalate is preferred as the silver compound for use in the present invention from the view point of high silver content and the fact that silver oxalate can be thermally decomposed without a reducing agent to easily generate metallic silver, so that impurities derived from the reducing agent are hardly contained in the prepared ink.

The amine is a compound derived from ammonia, with at least one hydrogen atom being replaced by a hydrocarbon group, including a primary amine, a secondary amine, and a tertiary amine. Further, the amine may be a monoamine, or may be a polyvalent amine such as a diamine. These may be used singly or in combination of two or more.

Preferably, the amine-containing protective agent includes, as the amine or amines, at least one selected from the group consisting a monoamine (1) containing 6 or more carbon atoms in total and represented by the following formula (a-1), wherein $R^2$, $R^2$ and $R^3$ are the same or different, and are each a hydrogen atom or a monovalent hydrocarbon group (excluding the case where all of $R^2$, $R^2$ and $R^3$ are hydrogen atoms); a monoamine (2) containing 5 or less carbon atoms in total and represented by the following formula (a-1), wherein $R^2$, $R^2$ and $R^3$ are the same or different, and are each a hydrogen atom or a monovalent hydrocarbon group (excluding the case where all of $R^2$, $R^2$ and $R^3$ are hydrogen atoms); and a diamine (3) containing 8 or less carbon atoms in total and represented by the following formula (a-2), wherein $R^8$ is a divalent hydrocarbon group, $R^4$ to $R^7$ are the same or different, and are each a hydrogen atom or a monovalent hydrocarbon group. More preferably, the amine-containing protective agent includes, as the amines, the monoamine (1), and at least one of the monoamine (2) and the diamine (3).

[Formula 2]

(a-1)

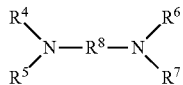

(a-2)

The hydrocarbon groups may be each an aliphatic hydrocarbon group, an alicyclic hydrocarbon group, or an aromatic hydrocarbon group. The hydrocarbon groups are each preferably an aliphatic hydrocarbon group or an alicyclic hydrocarbon group, and more preferably an aliphatic hydrocarbon group. Accordingly, the monoamine (1), the monoamine (2) and the diamine (3), are preferably an aliphatic monoamine (1), an aliphatic monoamine (2), and an aliphatic diamine (3), respectively.

Further, the monovalent aliphatic hydrocarbon group may be an alkyl group or an alkenyl group. The monovalent alicyclic hydrocarbon group may be a cycloalkyl group or a cycloalkenyl group. Furthermore, the divalent aliphatic hydrocarbon group may be an alkylene group or an alkenylene group, and the divalent alicyclic hydrocarbon group may be a cycloalkylene group or a cycloalkenylene group.

Examples of the monovalent hydrocarbon group as $R^2$, $R^2$ and $R^3$ include an alkyl group containing about 1 to 20 carbon atoms such as a methyl group, an ethyl group, a propyl group, an isopropyl group, a butyl group, an isobutyl group, an s-butyl group, a t-butyl group, a pentyl group, a hexyl group, a decyl group, a dodecyl group, a tetradecyl group, and an octadecyl groups; an alkenyl group containing about 2 to 20 carbon atoms such as a vinyl group, an allyl group, a methallyl group, a 1-propenyl group, an isopropenyl group, a 1-butenyl group, a 2-butenyl group, a 3-butenyl group, a 1-pentenyl group, a 2-pentenyl group, a 3-pentenyl group, a 4-pentenyl group, and a 5-hexenyl group; a cycloalkyl group containing about 3 to 20 carbon atoms such as a cyclopropyl group, a cyclobutyl group, a cyclopentyl group, a cyclohexyl group, and a cyclooctyl group; and a cycloalkenyl group containing about 3 to 20 carbon atoms such as a cyclopentenyl group and a cyclohexenyl group.

Examples of the monovalent hydrocarbon group as $R^4$ to $R^7$ include ones containing 7 or less carbon atoms in the above examples of the monovalent hydrocarbon group as $R^2$, $R^2$ and $R^3$.

Examples of the divalent hydrocarbon group as $R^8$ include an alkylene group containing 1 to 8 carbon atoms such as a methylene group, a methylmethylene group, a dimethylmethylene group, an ethylene group, a propylene group, a trimethylene group, a tetramethylene group, a pentamethylene group, and a heptamethylene group; and an alkenylene group containing 2 to 8 carbon atoms such as a vinylene group, a propenylene group, a 1-butenylene group, a 2-butenylene group, a butadienylene group, a pentenylene group, a hexenylene group, a heptenylene group, and an octenylene group.

The hydrocarbon groups as $R^1$ to $R^8$ may have various substituents such as a halogen atom, an oxo group, a hydroxyl group, a substituted oxy group (e.g., a $C_{1-4}$ alkoxy group, a $C_{6-10}$ aryloxy group, a $C_{7-16}$ aralkyloxy group, a $C_{1-4}$ acyloxy group, etc.), a carboxyl group, a substituted oxycarbonyl group (e.g., a $C_{1-4}$ alkoxycarbonyl group, a $C_{6-10}$ aryloxycarbonyl group, a $C_{7-16}$ aralkyloxycarbonyl group, etc.), a cyano group, a nitro group, a sulfo group, a heterocyclic group, etc. The hydroxyl group and the carboxyl group may be protected by a protecting group commonly used in the field of organic synthesis.

The monoamine (1) is a compound having a function of imparting high dispersibility to silver nanoparticles, and examples thereof include a primary amine having a straight-chain alkyl group such as hexylamine, heptylamine, octylamine, nonylamine, decylamine, undecylamine, dodecylamine, tridecylamine, tetradecylamine, pentadecyl amine, hexadecyl amine, heptadecylamine and octadecylamine; a primary amine having a branched-chain alkyl group such as isohexylamine, 2-ethylhexylamine and tert-octylamine; a primary amine having a cycloalkyl group such as cyclohexylamine; a primary amine having an alkenyl group such as oleylamine; a secondary amine having a straight-chain alkyl group such as N,N-dipropylamine, N,N-dibutylamine, N,N-dipentylamine, N,N-dihexylamine, N,N-dipeptylamine, N,N-dioctylamine, N,N-dinonylamine, N,N-didecylamine, N,N-diundecylamine, N,N-didodecylamine and N-propyl-N-butylamine; a secondary amine having a branched-chain alkyl group such as N,N-diisohexylamine and N,N-di(2-ethylhexyl)amine; a tertiary amine having a straight-chain alkyl group such as tributylamine and trihexylamine; and a tertiary amine having a branched-chain alkyl group such as triisohexylamine and tri(2-ethylhexyl)amine.

Among the monoamines (1), amines (in particular, primary amines) having a straight-chain alkyl group containing 6 or more carbon atoms in total (with an upper limit of the number of carbons in total of preferably about 18, more preferably 16, and particularly preferably 12, from the viewpoints of easy removal in sintering and availability of the monoamines), are preferred, and in particular, hexylamine, heptylamine, octylamine, nonylamine, decylamine, undecylamine, dodecylamine, etc., are preferred, from the viewpoint of securing an inter-nanoparticle distance between the silver nanoparticle on which the amino group of the monoamine (1) absorbed and another silver nanoparticle to offer a better effect to prevent aggregation of silver nanoparticles.[0060]

Further, among the monoamines (1), an amine (in particular, primary amine) having a branched-chain alkyl group can impart high dispersibility to silver nanoparticles with a less amount in comparison with an amine having a straight-chain alkyl group containing the same number of carbon atoms in total, due to the steric factor of the branched-chain alkyl group. As a result, during sintering, especially during low temperature sintering, the amine can be efficiently removed, so that a sintered body having more excellent conductivity can be favorably obtained.

As the amine having a branched-chain alkyl group, in particular, an amine having a branched-chain alkyl group with 6 to 16, and preferably 6 to 10, carbon atoms in total such as isohexylamine and 2-ethylhexylamine is preferred. In particular, from the viewpoint of the steric factor, an amine having a branched-chain alkyl group with a structure branched at a carbon atom positioned second from a nitrogen atom such as 2-ethylhexylamine is effective.

Since the monoamine (2) has a shorter hydrocarbon chain compared to the monoamine (1), it is believed that the function to impart high dispersibility to silver nanoparticles of the monoamine (2) itself is low. However, since the monoamine (2) has higher polarity than the monoamine (1), it is believed that the monoamine (2) has an effect to facilitate the complex formation due to the high coordinating ability to silver atoms. Further, since the hydrocarbon chain of the monoamine (2) is short, even in low temperature sintering, the removal of the monoamine (2) from the surface of silver nanoparticles can be performed in a short time, for example, in 30 minutes or less, and preferably in 20 minutes or less. As a result, a sintered body having excellent conductivity can be obtained.

Examples of the monoamine (2) include a primary amine containing 2 to 5 carbon atoms in total and having a straight-chain or branched-chain alkyl group, such as ethylamine, n-propylamine, isopropylamine, n-butylamine, isobutylamine, sec-butylamine, tert-butylamine, pentylamine, isopentylamine and tert-pentylamine; and a secondary amine containing 2 to 5 carbon atoms in total and having a straight-chain or branched-chain alkyl group, such as N,N-dimethylamine, N,N-diethylamine, N-methyl-N-propylamine and N-ethyl-N-propylamine.

As the monoamine (2), in particular, a primary amine containing 2 to 5 (preferably 4 to 5) carbon atoms in total and having a straight-chain or branched-chain alkyl group, such as n-butylamine, isobutylamine, sec-butylamine, tert-butylamine, pentylamine, isopentylamine and tert-pentylamine is preferred, and, in particular, a primary amine containing 2 to 5 (preferably 4 to 5) carbon atoms in total and having a straight-chain alkyl group, such as n-butylamine is preferred.

The diamine (3) has 8 or less, for example, 1 to 8, carbon atoms in total, and higher polarity than the monoamine (1). It is, therefore, believed that the diamine (3) has an effect to facilitate the complex formation due to the high coordinating ability to silver atoms. Further, in the thermal decomposition step of a complex, the diamine (3) has an effect to facilitate the thermal decomposition at a lower temperature in a short time, so that the production of silver nanoparticles can be more efficiently performed with use of the diamine (3). Further, surface-modified silver nanoparticles each having a configuration in which the silver nanoparticle is coated with a protective agent containing the diamine (3) exhibit excellent dispersion stability in a dispersion medium containing a solvent with high polarity. Further, due to having a short hydrocarbon chain, the diamine (3) can be removed from the surface of silver nanoparticles in a short time, for example, in 30 minutes or less, and preferably in 20 minutes or less even in low-temperature sintering. A sintered body excellent in conductivity can be therefore obtained.

Examples of the diamine (3) include a diamine represented by the formula (a-2), wherein $R^4$ to $R^7$ each are a hydrogen atom, and $R^8$ is a straight-chain or branched-chain alkylene group, such as ethylenediamine, 1,3-propanediamine, 2,2-dimethyl-1,3-propanediamine, 1,4-butanediamine, 1,5-pentanediamine, 1,6-hexanediamine, 1,7-heptanediamine, 1,8-octanediamine and 1,5-diamino-2-methylpentane; a diamine represented by the formula (a-2), wherein $R^4$ and $R^6$ are the same or different, and are each a straight-chain or branched-chain alkyl group, $R^5$ and $R^7$ are each a hydrogen atom, and $R^8$ is a straight-chain or branched-chain alkylene group, such as N,N'-dimethylethylenediamine, N,N'-diethylethylenediamine, N,N'-dimethyl-1,3-propanediamine, N,N'-diethyl-1,3-propanediamine, N,N'-dimethyl-1,4-butanediamine, N,N'-diethyl-1,4-butanediamine and N,N'-dimethyl-1,6-hexanediamine; and a diamine represented by the formula (a-2), wherein $R^4$ and $R^5$ are the same or different, and are each a straight-chain or branched-chain alkyl group, $R^6$ and $R^7$ are each a hydrogen atom, and $R^8$ is a straight-chain or branched-chain alkylene group, such as N,N-dimethylethylenediamine, N,N-diethylethylenediamine, N,N-dimethyl-1,3-propanediamine, N,N-diethyl-1,3-propanediamine, N,N-dimethyl-1,4-butanediamine, N,N-diethyl-1,4-butanediamine and N,N-dimethyl-1,6-hexanediamine.

Among them, a diamine represented by the formula (a-2), wherein $R^4$ and $R^5$ are the same or different, and are each a straight-chain or branched-chain alkyl group, $R^6$ and $R^7$ are each a hydrogen atom, and $R^8$ is a straight-chain or branched-chain alkylene group, in particular, a diamine represented by the formula (a-2), wherein $R^4$ and $R^5$ are each a straight-chain alkyl group, $R^6$ and $R^7$ are each a hydrogen atom, and $R^8$ is a straight-chain alkylene group, is preferred.

In a diamine represented by the formula (a-2), wherein $R^4$ and $R^5$ are the same or different and are each a straight-chain or branched-chain alkyl group, and $R^6$ and $R^7$ are each a hydrogen atom, i.e., a diamine having a primary amino group and a tertiary amino group, the primary amino group has high coordinating ability to silver atoms while the tertiary amino group has poor coordinating ability to silver atoms, so that a complex can be formed without excessive complication. Consequently, in a step of thermal decomposition of the complex, the thermal decomposition can be performed at a lower temperature in a short time. In particular, from the viewpoint of removal from the surface of silver nanoparticles in a short time in low-temperature sintering, a diamine containing 6 or less (e.g., 1 to 6) carbon atoms in total is preferred, and a diamine containing 5 or less (e.g., 1 to 5) carbon atoms in total is more preferred.

In the case where the amine for use in the present invention includes a monoamine (1), and at least one of a monoamine (2) and a diamine (3) together, the use ratios thereof are preferably in the following ranges, based on the total amount of amines [monoamine (1)+monoamine (2)+diamine (3); 100 mol %], though not particularly limited.

Content of monoamine (1): for example, 5 to 65 mol % with a lower limit of preferably 10 mol %, and particularly preferably 15 mol %, and with an upper limit of preferably 50 mol %, particularly preferably 40 mol %, and most preferably 35 mol %.

Total content of monoamine (2) and diamine (3): for example, 35 to 95 mol % with a lower limit of preferably 50 mol %, particularly preferably 60 mol %, and most preferably 65 mol %, and with an upper limit of preferably 90 mol %, and particularly preferably 85 mol %.

Further, in the case where a monoamine (2) and a diamine (3) are used together, the content of monoamine (2) and the content of diamine (3) are preferably in the following ranges, respectively, based on the total amine content [monoamine (1)+monoamine (2)+diamine (3); 100 mol %].

Monoamine (2): for example, 5 to 70 mol % with a lower limit of preferably 10 mol %, and particularly preferably 15 mol % and with an upper limit of preferably 65 mol %, and particularly preferably 60 mol %.

Diamine (3): for example, 5 to 50 mol % with a lower limit of preferably 10 mol %, and with an upper limit of preferably 45 mol %, and particularly preferably 40 mol %.

With a content of the monoamine (1) in the range, the dispersion stability of silver nanoparticles can be obtained. With a content of the monoamine (1) of less than the range, the dispersion stability of silver nanoparticles tends to be difficult to achieve. Meanwhile, with a content of the monoamine (1) of more than the range, the amine tends to be difficult to remove in low temperature sintering.

With a content of the monoamine (2) in the range, the effect to facilitate the complex formation tends to be easily obtained. Further, with a content of the monoamine (2) in the range, sintering can be performed at low temperature in a short time, and the diamine (3) can be easily removed from the surface of silver nanoparticles in sintering.

With a content of the diamine (3) in the range, an effect to facilitate the complex formation and an effect to facilitate thermal decomposition of the complex are easily obtained. Further, surface-modified silver nanoparticles each having a configuration in which the silver nanoparticle is coated with a protective agent containing the diamine (3) exhibit excellent dispersion stability in a dispersion medium containing a solvent with high polarity.

In the present invention, use of the monoamine (2) and/or the diamine (3) having high coordinating ability to silver atoms of a silver compound allows the amount of the monoamine (1) for use to be reduced corresponding to the use ratios of the monoamine (2) and/or the diamine (3). Consequently, in sintering at low temperature in a short time, the amines are easily removed from the surface of silver nanoparticles, so that the sintering of silver nanoparticles can proceed sufficiently.

Although the amine as a protective agent for use in the present invention may further include another amine in addition to the monoamine (1), the monoamine (2) and the diamine (3), the ratio of the total content of the monoamine (1), the monoamine (2) and the diamine (3) to the entire amine content in a protective agent is, for example, preferably 60 wt % or more, particularly preferably 80 wt % or more, and most preferably 90 wt % or more. Note that the upper limit is 100 wt %. In other words, the content of other amines is preferably 60 wt % or less, particularly preferably 20 wt % or less, and most preferably 10 wt % or less.

The amount of the amines (in particular, monoamine (1)+monoamine (2)+diamine (3)) used is, though not particularly limited, preferably about 1 to 50 mol; and, from the viewpoint of obtaining surface-modified silver nanoparticles in a substantially non-solvent, preferably 2 to 50 mol, and particularly preferably 6 to 50 mol, relative to 1 mol of silver atoms in the raw material silver compound. With an amount of the amines used lower than the range, the amount of the silver compound remaining without being unconverted into a complex tends to increase in the complex formation step, so that, in the subsequent thermal decomposition step, some of the silver particles may grow large to impair the uniformity of silver nanoparticles, and the silver compound may not be thermally decomposed to remain, which are undesirable.

The reaction between the amines and the silver compound is performed in the presence or absence of a solvent. As the solvent, for example, an alcohol solvent having 3 or more carbon atoms per molecule can be used.

Examples of the alcohol solvent include n-propanol (boiling point: 97° C.), isopropanol (boiling point: 82° C.), n-butanol (boiling point: 117° C.), isobutanol (boiling point: 107.89° C.), sec-butanol (boiling point: 99.5° C.), tert-butanol (boiling point: 82.45° C.), n-pentanol (boiling point: 136° C.), n-hexanol (boiling point: 156° C.), n-octanol (boiling point: 194° C.) and 2-octanol (boiling point: 174° C.). Among these, an alcohol solvent having 4 to 6 carbon atoms per molecule is preferred, and, in particular, n-butanol and n-hexanol are preferred, from the viewpoints of allowing the temperature in the step for thermally decomposing the complex to be set high, and of convenience in dealing with the resulting surface-modified silver nanoparticles.

The amount of the solvent used is, for example, 120 parts by weight or more, preferably 130 parts by weight or more, and more preferably 150 parts by weight or more, relative to 100 parts by weight of the silver compound. Note that the upper limit of the amount of solvent used is, for example, 1000 parts by weight, preferably 800 parts by weight, and particularly preferably 500 parts by weight, relative to 100 parts by weight of the silver compound.

In the present invention, in order to further improve the dispersibility of silver nanoparticles, one or two or more aliphatic monocarboxylic acids may be additionally used as the protective agent. With use of aliphatic monocarboxylic acids, the stability of silver nanoparticles, in particular, the stability in a state dispersed in the solvent (B), tends to be improved.

Examples of the aliphatic monocarboxylic acid include a saturated aliphatic monocarboxylic acid containing 4 or more carbon atoms such as butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid and icosanoic acid; an unsaturated aliphatic monocarboxylic acid containing 8 or more carbon atoms such as oleic acid, elaidic acid, linoleic acid, palmitoleic acid and eicosenoic acid.

Among them, a saturated or unsaturated aliphatic monocarboxylic acid containing 8 to 18 carbon atoms (in particular, octanoic acid, oleic acid, etc.) is preferred. When the carboxyl group of the aliphatic monocarboxylic acid is adsorbed on the surface of silver nanoparticles, a saturated or unsaturated aliphatic hydrocarbon chain containing 8 to 18 carbon atoms makes a steric hindrance to secure an inter-nanoparticle distance between the silver nanoparticle with the aliphatic monocarboxylic acid and another silver nanoparticle, so that the effect to prevent aggregation of silver nanoparticles can be improved. Further, the aliphatic monocarboxylic acid is preferred because of its easy availability and its easy removability in sintering.

The amount of the aliphatic monocarboxylic acid used is, for example, about 0.05 to 10 mol, preferably 0.1 to 5 mol, and particularly preferably 0.5 to 2 mol, relative to 1 mol of silver atoms of a silver compound. With an amount of the aliphatic monocarboxylic acid used lower than the range, the effect on improvement in the dispersion stability tends to be difficult to obtain. On the other hand, even with use of the aliphatic monocarboxylic acid in an excessive amount, the effect on improvement in the dispersion stability is saturated and the removal in low temperature sintering tends to be difficult.

Preferably, the reaction between the protective agent containing amines and a silver compound is performed at normal temperature (5 to 40° C.). Since the reaction involves heat generation due to a coordination reaction between the amines and the silver compound, appropriate cooling may be performed such that the temperature is controlled in the range.

The reaction time between the protective agent containing amines and a silver compound is, for example, about 30 minutes to 3 hours. A silver-amine complex can be thus obtained.

Thermal Decomposition Step

The thermal decomposition step is a step of thermally decomposing a silver-amine complex obtained through a complex formation step so as to form surface-modified silver nanoparticles. It is believed that by heating the silver-amine complex, a silver compound is thermally decomposed to release or form silver atoms, while the coordination bond between the silver atom and the amine is maintained; and subsequently the silver atoms coordinated with the amines aggregate to form silver nanoparticles coated with an amine protective layer which plays a role in preventing re-aggregation between the silver nanoparticles.

The thermal decomposition is performed preferably in the presence of a solvent. As the solvent, the alcohol solvent described above may be suitably used. The thermal decomposition temperature may be a temperature at which the surface-modified silver nanoparticles are formed. In the case where the silver-amine complex is a silver oxalate-amine complex, the thermal decomposition temperature is, for example, about 80 to 120° C., preferably 95 to 115° C., and particularly preferably 100 to 110° C. From the viewpoint of preventing detachment of the surface modifying agent or portion from the surface-modified silver nanoparticles, a lower temperature in the temperature range is preferred. The thermal decomposition time is, for example, about 10 minutes to 5 hours.

Preferably, the thermal decomposition of the silver-amine complex is performed under an air atmosphere or an inert gas, such as argon, atmosphere.

Cleaning Step

In the case where an excessive protecting agent (e.g., amines) is present after completion of the thermal decomposition reaction of the silver-amine complex, decantation is preferably performed once or repeatedly twice or more for removal thereof. After the decantation, the surface-modified silver nanoparticles in a wet state are directly supplied to an ink preparation step described below without being dried and solidified, so that the re-aggregation of the silver nanoparticles can be inhibited or suppressed to maintain the high dispersibility of the silver nanoparticles.

In the case where the surface-modified silver nanoparticles are not dried and solidified, a cleaning solvent for use in decantation is inevitably mixed into the ink for screen printing of the present invention. Accordingly, as the cleaning solvent, especially as the last cleaning solvent when the cleaning step is repeated twice or more, it is preferable to use a solvent that does not impair the properties of the ink for screen printing of the present invention. In particular, use of a compound, as the cleaning solvent, represented by the formula (b') described above is preferred from the viewpoint of excellent cleaning without impairment of the high dispersibility of the silver nanoparticles, and of the continuous use of the ink in successive screen printing operations, i.e., the continuous printability of the ink. Among the compounds represented by the formula (b') described above, a compound having a boiling point of, for example, 130 to 200° C., preferably 130 to 180° C., and particularly preferably 140 to 180° C., is preferably used to achieve excellent cleaning performance without impairment of the high dispersibility of the silver nanoparticles, and of the continuous printability of the ink, allowing the sintered body obtained therefrom to have a particularly excellent conductivity.

Decantation is performed, for example, by washing or cleaning the surface-modified silver nanoparticles in a suspended state with a cleaning solvent, and precipitating the nanoparticles by centrifugation to remove the supernatant.

The content ratio of the cleaning solvent relative to the total amount of the surface-modified silver nanoparticles in a wet state obtained by decantation is, for example, about 5 to 15 wt %. The ratio of the surface-modified silver nanoparticles themselves relative to the total amount of the surface-modified silver nanoparticles in a wet state is, therefore, for example, about 85 to 95 wt %.

Ink Preparation Step

The ink preparation step is a step of mixing surface-modified silver nanoparticles (A) obtained through the step described above (preferably, surface-modified silver nanoparticles (A) in a wet state with use of a cleaning solvent), a solvent (B) containing at least a terpene solvent, and an additive on an as needed basis so as to obtain the ink for screen printing of the present invention. For the mixing, a commonly known mixing device such as a planetary centrifugal stirrer/defoamer, a homogenizer, a planetary mixer, a three-roll mill, and a bead mill can be used. Each of the components may be simultaneously mixed, or may be sequentially mixed.

The mixing ratio of each of the components may be appropriately adjusted in a range where the ink for screen printing having the composition described below can be obtained.

The content of the surface-modified silver nanoparticles in the total amount of the ink for screen printing of the present invention (100 wt %) is, for example, 60 to 85 wt %, with a lower limit of preferably 70 wt % from the viewpoint of obtaining an effect to improve adhesion of the ink to a substrate, with an upper limit of preferably 80 wt %, and particularly preferably 75 wt %.

The content of the terpene solvent in the total amount of the ink for screen printing of the present invention (100 wt %) is, for example, 5 to 30 wt %, with a lower limit of preferably 10 wt %, and particularly preferably 14 wt %, with an upper limit of preferably 25 wt %, and particularly preferably 18 wt %. According to the ink with a content of the terpene solvent in the range, an effect to inhibit or suppress spreading and to improve drawing precision of fine lines in screen printing, and an effect to improve the continuous printability of the ink can be obtained.

The content of a compound represented by the formula (b) in the total amount of the ink for screen printing of the present invention (100 wt %) is, for example, 0.5 to 5 wt %, with a lower limit of preferably 1.6 wt % with an upper limit of preferably 3 wt %, and particularly preferably 2 wt %. According to the ink with a content of the compound represented by the formula (b) in the range, thixotropic properties are imparted, so that sharper edges of a drawn part can be obtained causing improved printing precision. According to the ink with a content of the compound represented by the formula (b) in the range, an effect to improve the continuous printability of the ink can be also obtained.

Further, the ink for screen printing of the present invention may contain a compound represented by the formula (b') in the range of, for example, 10 wt % or less (5 to 10 wt %), and preferably 8.5 wt % or less relative to the total amount of the ink.

The ink for screen printing of the present invention may also contain a solvent having a boiling point of less than 130° C., such as ethylene glycol dimethyl ether (boiling point: 85° C.), propylene glycol monomethyl ether (boiling point: 120° C.), and propylene glycol dimethyl ether (boiling point: 97° C.). The content of the solvent having a boiling point of less than 130° C. (in the case where two or more of the solvents are contained, the total content thereof), however, is 20 wt % or less, preferably 10 wt % or less, particularly preferably 5 wt % or less, and most preferably 1 wt % or less, relative to the total amount of the ink for screen printing of the present invention (100 wt %). Since the content of the solvent having a boiling point of less than 130° C. is controlled in the range, clogging of a screen plate caused by volatilization of the solvent can be inhibited or suppressed, which enables successive screen printing operations.

The ink for screen printing of the present invention has a viscosity at a shear rate of 10 (1/s) and 25° C. of 60 Pa·s or more, preferably 70 Pa·s or more, more preferably 80 Pa·s or more, further preferably 90 Pa·s or more, further preferably 100 Pa·s or more, and particularly preferably 150 Pa·s or more, with an upper limit of the viscosity of, for example, about 500 Pa·s, preferably 450 Pa·s, particularly preferably 400 Pa·s, and most preferably 350 Pa·s.

The ink for screen printing of the present invention has a viscosity at 25° C. and a shear rate of 100 (1/s) in the range of, for example, 10 to 100 Pa·s, with an upper limit of the viscosity of preferably 80 Pa·s, particularly preferably 60 Pa·s, most preferably 50 Pa·s, and especially preferably 40 Pa·s with a lower limit of the viscosity of preferably 15 Pa·s, particularly preferably 20 Pa·s, most preferably 25 Pa·s, and especially preferably 30 Pa·s.

Preferably the ink for screen printing of the present invention has thixotropic properties, with a TI value (viscosity at shear rate of 10 (1/s)/viscosity at shear rate of 100 (1/s)) at 25° C. of, for example, 3.0 to 10.0, preferably 3.5 to 7.0, particularly preferably 4.0 to 6.5, most preferably 4.5 to 6.3, and especially preferably 4.8 to 6.2.

The ink for screen printing of the present invention is excellent in dispersion stability. For example, when the ink for screen printing having a silver concentration of 65 wt % is stored at 5° C., increase in viscosity can be inhibited or suppressed for a period of 1 month or more.

Method for Producing an Electronic Device

The method for producing an electronic device of the present invention includes the steps of applying the ink on a substrate by screen printing, and sintering the ink.

In the method for producing an electronic device of the present invention, use of the ink for screen printing enables low-temperature sintering at a sintering temperature of, for example, 130° C. or less, and particularly preferably 120° C. or less, with a lower limit of, for example, 60° C., and more preferably 100° C. for enabling sintering in a short time. Sintering time is, for example 0.5 to 3 hours, preferably 0.5 to 2 hours, and particularly preferably 0.5 to 1 hour.

With use of the ink for screen printing of the present invention, the sintering of silver nanoparticles can proceed sufficiently even in low-temperature sintering (preferably in sintering at low temperature in a short time). As a result, a sintered body excellent in conductivity, having a volume resistivity of, for example, 10 μΩcm or less, preferably 8

μΩcm or less, and particularly preferably 6 μΩcm or less, can be obtained. The conductivity (or volume resistivity) of a sintered body can be measured by the method described in Examples.

Use of the ink for screen printing of the present invention enables low-temperature sintering as described above, so that in addition to a glass substrate and a heat-resistant plastic substrate such as a polyimide film, a general-purpose plastic substrate having low heat resistance including a polyester film such as a polyethylene terephthalate (PET) film and a polyethylene naphthalate (PEN) film, and a polyolefin film such as a polypropylene film may be suitably used.

The electronic device obtained by the method for producing an electronic device of the present invention, includes, for example, a liquid crystal display, an organic EL display, a field emission display (FED), an IC card, an IC tag, a solar cell, an LED device, an organic transistor, a capacitor, an electronic paper, a flexible battery, a flexible sensor, a membrane switch, a touch panel, and an EMI shield.

EXAMPLES

The present invention is more specifically described in the following Examples, though the present invention is not limited thereto.

Preparation Example 1 (Preparation of Surface-Modified Silver Nanoparticles (1))

From silver nitrate (manufactured by Wako Pure Chemical Industries, Ltd.) and oxalic acid dihydrate (manufactured by Wako Pure Chemical Industries, Ltd.), silver oxalate (molecular weight: 303.78) was obtained.

A 500 mL flask was charged with 40.0 g (0.1317 mol) of silver oxalate, and 60 g of n-butanol was added thereto to prepare an n-butanol slurry of silver oxalate. Into the slurry, amine mixture consisting of 115.58 g (1.5802 mol) of n-butylamine (molecular weight: 73.14, reagent manufactured by Tokyo Chemical Industry, Ltd.), 51.06 g (0.3950 mol) of 2-ethylhexylamine (molecular weight: 129.25, reagent manufactured by Wako Pure Chemical industry Co., Ltd.), and 17.02 g (0.1317 mol) of n-octylamine (molecular weight: 129.25, reagent manufactured by Tokyo Chemical industry Co., Ltd.) were dropped at 30° C. After the dropwise addition, the resulting mixture was stirred at 30° C. and for 1 hour, so that a complex formation reaction between silver oxalate and amines proceeded. After formation of a silver oxalate-amine complex, the product was heated at 110° C. for 1 hour to thermally decompose the silver oxalate-amine complex, so that a suspension containing dark blue-colored surface-modified silver nanoparticles was obtained.

The resulting suspension was cooled, to which 120 g of methanol (special grade reagent manufactured by Wako Pure Chemical Industries, Ltd.) was added and stirred. Subsequently, surface-modified silver nanoparticles in the suspension were precipitated by centrifugation, and the supernatant was removed. To the surface-modified silver nanoparticles, 120 g of butyl carbitol (reagent manufactured by Tokyo Chemical Industry Co., Ltd.) was added and stirred. Subsequently, the surface-modified silver nanoparticles in the suspension were precipitated by centrifugation, and the supernatant was removed. Thus, butyl carbitol-containing surface-modified silver nanoparticles (1) in a wet state were obtained. From the thermobalance results using TG/DTA6300 manufactured by SII (Seiko Instruments Inc.), the content of the surface-modified silver nanoparticles was 90 wt % in the total amount of the surface-modified silver nanoparticles in a wet state (100 wt %). In other words, the surface-modified silver nanoparticles in a wet state contained 10 wt % of butyl carbitol.

Further, the surface-modified silver nanoparticles (1) in a wet state were observed by a scanning electron microscope (JSM-6700F manufactured by JEOL Ltd.). The particle diameters of 10 pieces of silver nanoparticles arbitrarily selected in an SEM photograph were obtained to determine the average thereof as the average particle diameter. The average particle diameter of the silver nanoparticle portion of the surface-modified silver nanoparticles (primary particle diameter) was about 50 nm.

Preparation Example 2 (Preparation of Surface-Modified Silver Nanoparticles (2))

Surface-modified silver nanoparticles (2) in a wet state containing 10 wt % of propylene glycol monobutyl ether were obtained in the same manner as in Preparation Example 1, except that propylene glycol monobutyl ether was used instead of butyl carbitol.

Preparation Example 3 (Preparation of Surface-Modified Silver Nanoparticles (3))

Surface-modified silver nanoparticles (3) in a wet state containing 10 wt % of propylene glycol monopropyl ether were obtained in the same manner as in Preparation Example 1, except that propylene glycol monopropyl ether was used instead of butyl carbitol.

Preparation Example 4 (Preparation of Surface-Modified Silver Nanoparticles (4))

Surface-modified silver nanoparticles (4) in a wet state containing 10 wt % of 3-methoxy-1-butanol were obtained in the same manner as in Preparation Example 1, except that 3-methoxy-1-butanol was used instead of butyl carbitol.

Preparation Example 5 (Preparation of Surface-Modified Silver Nanoparticles (5))

Surface-modified silver nanoparticles (5) in a wet state containing 10 wt % of propylene glycol monoethyl ether were obtained in the same manner as in Preparation Example 1, except that propylene glycol monoethyl ether was used instead of butyl carbitol.

Preparation Example 6 (Preparation of Surface-Modified Silver Nanoparticles (6))

Surface-modified silver nanoparticles (6) in a wet state containing 10 wt % of ethylene glycol mono-t-butyl ether were obtained in the same manner as in Preparation Example 1, except that ethylene glycol mono-t-butyl ether was used instead of butyl carbitol.

Example 1 (Preparation of Silver Ink)

THA-70, DPMIA, and EC300 were added and stirred for 3 hours in an oil bath (100 rpm) to yield a mixture. Subsequently, the mixture was stirred and kneaded (3 times, 2 minutes for each) by a planetary kneader (MAZERUSTAR KKK2508 manufactured by Kurabo Industries Ltd.), so that a liquid A was prepared.

The liquid A was added to the surface-modified silver nanoparticles (1) in a wet state (containing 10 wt % of butyl carbitol) prepared in Preparation Example 1. Subsequently, the mixture was stirred and kneaded (3 times, 2 minutes for each) by a planetary kneader (MAZERUSTAR KKK2508 manufactured by Kurabo Industries Ltd.), so that a deep brown-colored silver ink was prepared.

Examples 2 to 6, and Comparative Examples 1 to 4

To prepare each of the inks, processing was performed in the same manner as in Example 1, except that the formulation was changed as described in the following Table 1 (unit: part by weight).

Regarding each of the silver inks obtained in Examples 2 to 6 and Comparative Examples 1 to 4, printability, successive screen printing operations, fine line drawing, conductivity of the sintered body, and adhesion to a substrate of the sintered body were evaluated by the following methods.

Evaluation on Printability

The printability of the silver inks obtained in Examples 2 to 6 and Comparative Examples 1 to 4 were evaluated based on the following criteria.

Good: precise printing is achieved by screen printing.

Fair: printing can be performed by screen printing, with occurrence of ink spreading and broken lines.

Poor: printing cannot be performed by screen printing.

Evaluation on Fine Line Drawing

Using the silver ink obtained in each of Examples 2 to 6 and Comparative Examples 1 to 4, fine lines were drawn on a PET film substrate at 25° C. by a screen printing apparatus (LS-150TV manufactured by Newlong Seimitsu Kogyo Co., Ltd.). The fine line drawing was evaluated based on the minimum value of the line width of fine lines precisely drawn.

Evaluation on Conductivity of Sintered Body

The silver ink obtained in each of Examples 2 to 6 and Comparative Examples 1 to 4 was applied to a soda glass plate so as to form a coating film. Immediately after formation of the coating film, the coating film was sintered under conditions at 120° C. for 30 minutes in a hot air drying furnace, so that a sintered body having a thickness of about 2 μm was obtained. The volume resistivity of the sintered body thus obtained was measured by a four-terminal method (Loresta GP MCP-T610) to evaluate the conductivity of the sintered body.

Evaluation on Adhesion to Substrate of Sintered Body

A soda glass plate/sintered body obtained in the same manner as in the evaluation on conductivity was used as a sample. The sample was subjected to a tape peeling test (according to JIS K 5600). The adhesion to a substrate of the sintered body was evaluated as follows. When 100% of the sintered body remained, the adhesion was evaluated as "good". When not less than 60% and less than 100% of the sintered body remained, the adhesion was evaluated as "fair". When less than 60% of the sintered body remained, the adhesion was evaluated as "poor".

TABLE 1

|  | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|
| Surface-modified silver nanoparticles | 71 | 72 | 73 | 74 | 75 | 65 | 65 | 65 | 65 | 65 |
| Butyl carbitol | 7.9 | 8 | 8.1 | 8.2 | 8.3 | 7.2 | 7.2 | 7.2 | 7.2 | 7.2 |
| THA-70 | 16.7 | 15.8 | 14.8 | 13.8 | 12.8 | 22.7 |  |  |  |  |
| Dihydroterpineol |  |  |  |  |  |  | 22.7 |  | 22.7 | 22.7 |
| Dihydroterpinyl acetate |  |  |  |  |  |  |  | 22.7 |  |  |
| DPMIA | 1.9 | 1.8 | 1.6 | 1.5 | 1.4 | 2.5 | 2.5 | 2.5 |  |  |
| p-Menthane |  |  |  |  |  |  |  |  | 2.5 |  |
| TOE-100 |  |  |  |  |  |  |  |  |  | 2.5 |
| EC300 | 2.5 | 2.5 | 2.5 | 2.5 | 2.5 | 2.5 | 2.5 | 2.5 | 2.5 | 2.5 |
| Viscosity (Pa · s) at a shear rate of 10 (1/s) | 178 | 252 | 243 | 344 | 459 | 90 | 47.5 | 48.7 | 59.7 | 54.1 |
| Viscosity (Pa · s) at a shear rate of 100 (1/s) | 38 | 47 | 45 | 61 | 70 | 22 | 11.8 | 12.7 | 15 | 14 |
| TI value | 4.7 | 5.4 | 5.4 | 5.6 | 5.6 | 4 | 4 | 3.8 | 4 | 3.9 |
| Printability | Good | Good | Good | Fair | Fair | Good | Fair | Fair | Fair | Fair |
| successive screen printing operations | Good | Good | Good | Good | Good | Good | — | — | — | — |
| Fine line drawing (μm) | 40 | 40 | 40 | 40 | 35 | 40 | 60 | 60 | 60 | 60 |
| Volume resistivity (μΩcm) | 6.54 | 6.88 | 6.76 | 6.33 | 8.98 | 6.73 | 12.08 | 9.55 | 29.85 | 20.54 |
| Adhesion to substrate | Good | Good | Good | Good | Good | Fair | Poor | Poor | Poor | Poor |

THA-70: 4-(1'-acetoxy-1'-methyl ester)-cyclohexanol acetate, trade name "TERUSOLVE THA-70" manufactured by Nippon Terpene Chemicals Inc., boiling point: 223° C., viscosity: 198 mPa · s.
Dihydroterpineol: manufactured by Nippon Terpene Chemicals Inc., boiling point: 210° C., viscosity (20° C.): 83 mPa · s.
Dihydroterpinyl acetate: manufactured by Nippon Terpene Chemicals Inc., boiling point: 220 to 225° C., viscosity (20° C.): 7 mPa · s.
DPMIA: Dipropylene glycol-methyl-isopentyl ether, boiling point: 227° C., manufactured by Daicel Corporation.
p-Menthane: 1-methyl-4-(1-methylethyl)cyclohexane, manufactured by Nippon Terpene Chemicals Inc., boiling point: 168° C.
TOE-100: 2-(1-methyl-1-(4-methyl-3-cyclohexenyl)ethoxy)ethanol, trade name "TERUSOLVE TOE-100", manufactured by Nippon Terpene Chemicals Inc., boiling point: 268 to 282° C.
EC300: ethyl cellulose resin, trade name "Ethocel™ std. 300", manufactured by The Dow Chemical Company.

Evaluation on successive screen printing operations

The silver ink obtained in each of Examples 2 to 6 and Comparative Examples 1 to 4 was printed on a PET film at 25° C., by a screen printing apparatus (LS-150TV manufactured by Newlong Seimitsu Kogyo Co., Ltd.). When 40 or more successive or consecutive screen printing operations were achieved, it was evaluated as "good". When less than 40 successive or consecutive screen printing operations were achieved, it was evaluated as "poor".

Examples 7 to 11

To prepare each of the inks, processing was performed in the same manner as in Example 1 to obtain a silver ink, except that one of the surface-modified silver nanoparticles (2) to (6) in a wet state obtained in Preparation Examples 2 to 6 was used instead of the surface-modified silver nanoparticles (1) in a wet state (containing 10 wt % of butyl carbitol), and the formulation was changed to have the component content as described in the following Table 2 (unit: part by weight).

The silver ink obtained in each of Examples 7 to 11 was applied to a soda glass plate so as to form a coating film. Immediately after formation of the coating film, the coating film was sintered under conditions at 120° C. for 30 minutes with a hot plate, so that a sintered body was obtained. The volume resistivity of the sintered body thus obtained was measured by the same method described above.

TABLE 2

|  | Example 7 | Example 8 | Example 9 | Example 10 | Example 11 |
| --- | --- | --- | --- | --- | --- |
| Surface-modified silver nanoparticles | 70 | 70 | 70 | 70 | 70 |
| Propylene glycol monobutyl ether | 7.78 | | | | |
| Propylene glycol monopropyl ether | | 7.78 | | | |
| 3-Methoxy-1-butanol | | | 7.78 | | |
| Propylene glycol monoethyl ether | | | | 7.78 | |
| Ethylene glycol mono-t-butyl ether | | | | | 7.78 |
| Dihydroterpineol | 19.73 | 19.73 | 19.73 | 19.73 | 19.73 |
| EC300 | 2.49 | 2.49 | 2.49 | 2.49 | 2.49 |
| Viscosity (Pa·s) at a shear rate of 10 (1/s) | 215.0 | 203.0 | 254.0 | 190.0 | 251.0 |
| Viscosity (Pa·s) at a shear rate of 100 (1/s) | 41.2 | 38.7 | 44.2 | 37.3 | 46.2 |
| TI value | 5.22 | 5.25 | 5.75 | 5.09 | 5.43 |
| Thickness of sintered body (μm) | 1.72 | 4.70 | 2.34 | 3.51 | 8013 |
| Surface resistivity (Ω) | 0.02 | 0.01 | 0.02 | 0.02 | 0.01 |
| Volume resistivity (μΩcm) | 3.66 | 5.33 | 5.78 | 5.65 | 7.09 |

Examples 12 to 16

Each of the silver inks was obtained in the same manner as in Example 9, except that the mixing ratio was changed as described in Table 3 (unit: part by weight).

The silver ink obtained in each of Examples 12 to 16 was applied to a soda glass plate so as to form a coating film. Immediately after formation of the coating film, the coating film was sintered under conditions at 120° C. for 30 minutes with a hot plate, so that a sintered body was obtained. The volume resistivity of the sintered body thus obtained was measured by the same method described above.

TABLE 3

|  | Example 12 | Example 13 | Example 14 | Example 15 | Example 16 |
| --- | --- | --- | --- | --- | --- |
| Surface-modified silver nanoparticles | 69.00 | 69.00 | 65.00 | 65.00 | 65.00 |
| 3-Methoxy-1-butanol | 7.70 | 7.70 | 7.20 | 7.20 | 7.20 |
| Dihydroterpineol | 21.80 | 21.55 | 25.80 | 25.55 | 25.30 |
| EC300 | 1.50 | 1.75 | 2.00 | 2.25 | 2.50 |
| Viscosity (Pa·s) at a shear rate of 10 (1/s) | 60.80 | 81.30 | 134.00 | 170.00 | 235.00 |
| Viscosity (Pa·s) at a shear rate of 100 (1/s) | 12.40 | 16.60 | 22.30 | 28.70 | 37.20 |
| TI value | 4.90 | 4.90 | 6.01 | 5.92 | 6.32 |
| Thickness of sintered body (μm) | 4.49 | 4.16 | 4.12 | 4.40 | 4.61 |
| Surface resistivity (Ω) | 0.01 | 0.01 | 0.01 | 0.01 | 0.01 |
| Volume resistivity (μΩcm) | 4.1 | 4.39 | 4.86 | 5.56 | 6.72 |

From Tables 2 and 3, it was found that use of a glycol ether solvent having a boiling point of 130 to 200° C. in the ink further enhances thixotropic properties of the ink than use of ones having a boiling point of more than 200° C. in the ink, so that a sintered body having more excellent conductivity can be formed from the ink. Also, it was found that through adjustment of the amount of EC300 as binder resin added in the ink, the viscosity of the ink can be controlled in a desired range while maintaining the sintered body conductivity high.

INDUSTRIAL APPLICABILITY

With use of the ink of the present invention, fine lines can be precisely drawn in screen printing. Further, the ink has extremely low volatility at the screen printing temperature, so that clogging of a screen plate is inhibited or suppressed, which enables 40 or more successive screen printing operations. Also, a sintered body with excellent conductivity can be formed from the ink of the present invention by sintering the ink after application. Accordingly, the ink of the present invention can be suitably used to produce electronic components on a plastic substrate with the use of screen printing.

The invention claimed is:

1. An ink comprising surface-modified silver nanoparticles (A), a solvent (B), and a binder resin (C);
    wherein the ink has a viscosity at a shear rate of 10 (1/s) and 25° C. of 344 Pa·s or more;
    wherein the ink has a TI value, viscosity at a shear rate of 10 (1/s)/viscosity at a shear rate of 100 (1/s), at 25° C. of 3.0 to 5.6;
    wherein the surface-modified silver nanoparticles (A) each comprises a silver nanoparticle, and an amine-containing protective agent coating a surface of the silver nanoparticle; and
    wherein the solvent (B) comprises a terpene solvent having a boiling point of 200° C. or more and a glycol ether solvent having a boiling point of 130° C. or more, and a content of solvents having a boiling point of less than 130° C., in the solvent (B), being 20 wt % or less based on the total amount of solvents.

2. The ink according to claim 1, wherein the amine-containing protective agent comprises, as the amine, an aliphatic monoamine (1) containing 6 or more carbon atoms in total, and at least one of an aliphatic monoamine (2) containing 5 or less carbon atoms in total and an aliphatic diamine (3) containing 8 or less carbon atoms in total.

3. The ink according to claim 2, wherein the aliphatic monoamine (1) containing 6 or more carbon atoms in total is a monoamine containing 6 to 18 carbon atoms in total and having a straight-chain alkyl group, and/or a monoamine containing 6 to 16 carbon atoms in total and having a branched-chain alkyl group.

4. The ink according to one of claims 2 and 3, wherein the aliphatic monoamine (2) containing 5 or less carbon atoms in total is a monoamine containing 2 to 5 carbon atoms in total and having a straight-chain or branched-chain alkyl group.

5. The ink according to claim 2, wherein the aliphatic diamine (3) containing 8 or less carbon atoms in total is a diamine containing 1 to 8 carbon atoms in total and represented by the following formula (a-2):

wherein $R^4$ and $R^5$ are the same or different, and are each a straight-chain or branched-chain alkyl group; $R^6$ and $R^7$ are each a hydrogen atom; and $R^8$ is a straight-chain or branched-chain alkylene group.

6. The ink according to claim 1, wherein the terpene solvent has a viscosity at 20° C. of 50 to 250 mPa·s.

7. The ink according to claim 1, wherein the glycol ether solvent comprises a compound represented by the following formula (b):

wherein $R^{11}$ and $R^{12}$ are the same or different, and each represent an alkyl group or an acyl group; $R^{13}$ represents an alkylene group containing 1 to 6 carbon atoms; and m represents an integer of 1 or more.

8. The ink according to claim 7, wherein the glycol ether solvent comprises at least one selected from the group consisting of ethylene glycol methyl ether acetate, ethylene glycol-n-butyl ether acetate, propylene glycol methyl-n-propyl ether, propylene glycol methyl-n-butyl ether, propylene glycol methyl isoamyl ether, propylene glycol diacetate, propylene glycol methyl ether acetate, 3-methoxybutyl acetate, 1,3-butylene glycol diacetate, 1,4-butanediol diacetate, 1,6-hexane diol diacetate, diethylene glycol dimethyl ether, diethylene glycol diethyl ether, diethylene glycol dibutyl ether, diethylene glycol ethyl methyl ether, diethylene glycol isopropyl methyl ether, diethylene glycol methyl-n-butyl ether, diethylene glycol-n-butyl ether acetate, diethylene glycol ethyl ether acetate, diethylene glycol butyl ether acetate, dipropylene glycol methyl-isopentyl ether, dipropylene glycol dimethyl ether, dipropylene glycol methyl-n-propyl ether, dipropylene glycol methyl-n-butyl ether, dipropylene glycol methyl cyclopentyl ether, dipropylene glycol methyl ether acetate, triethylene glycol dimethyl ether, triethylene glycol methyl-n-butyl ether, tripropylene glycol methyl-n-propyl ether, tripropylene glycol dimethyl ether, and tetraethylene glycol dimethyl ether.

9. The ink according to claim 1, wherein a sintered body obtained by sintering the ink at 120° C. for 30 minutes has a volume resistivity of 10 μΩcm or less.

10. The ink according to claim 1, wherein an average primary particle diameter of the silver nanoparticles of the surface-modified silver nanoparticles (A) is 0.5 to 100 nm.

11. The ink according to claim 1, wherein a content of the surface-modified silver nanoparticles is 60 to 85 wt % based on the total amount of the ink.

12. The ink according to claim 1, wherein a content of the terpene solvent is 5 to 30 wt % based on the total amount of the ink.

13. The ink according to claim 1, wherein the terpene solvent comprises at least one selected from the group consisting of 4-(1'-acetoxy-1'-methyl ester)-cyclohexanol acetate, 1,2,5,6-tetrahydrobenzyl alcohol, 1,2,5,6-tetrahydrobenzyl acetate, cyclohexyl acetate, 2-methylcyclohexyl acetate, 4-t-butylcyclohexyl acetate, terpineol, dihydroterpineol, dihydroterpinyl acetate, α-terpineol, β-terpineol, γ-terpineol, L-α-terpineol, dihydroterpinyl oxyethanol, terpinyl methyl ether, and dihydroterpinyl methyl ether.

14. The ink according to claim 1, wherein a content of the binder resin (C) is 0.5 to 5.0 wt % based on the total amount of the ink.

15. The ink according to claim 1, wherein the binder resin (C) comprises at least one selected from the group consisting of vinyl chloride-vinyl acetate copolymer resin, a polyvinyl butyral resin, a polyester resin, an acrylic resin, and a cellulose resin.

16. The ink according to claim 1, wherein a TI value, viscosity at a shear rate of 10 (1/s)/viscosity at a shear rate of 100 (1/s) at 25° C. of the ink is 3.0 to 5.4.

17. The ink according to claim 1, wherein a TI value, viscosity at a shear rate of 10 (1/s)/viscosity at a shear rate of 100 (1/s), at 25° C. of the ink is 4.7 to 5.6.

18. A method for producing an electronic device, comprising the steps of applying the ink according to claim 1 on a substrate by screen printing, and sintering the ink.

19. An electronic device comprising a substrate and a sintered body of the ink according to claim 1 disposed on the substrate.

20. An ink comprising surface-modified silver nanoparticles (A), a solvent (B), and a binder resin (C);
wherein the ink has a viscosity at a shear rate of 10 (1/s) and 25° C. of 344 Pa·s or more;
wherein the ink has a TI value, viscosity at a shear rate of 10 (1/s)/viscosity at a shear rate of 100 (1/s), at 25° C. of 3.0 to 5.6;
wherein the surface-modified silver nanoparticles (A) each comprises a silver nanoparticle, and an amine-containing protective agent coating a surface of the silver nanoparticle; and
wherein the solvent (B) comprises a terpene solvent having a boiling point of 200° C. or more, and a content of solvents having a boiling point of less than 130° C., in the solvent (B), being 20 wt % or less based on the total amount of solvents.

21. An ink comprising surface-modified silver nanoparticles (A), a solvent (B), and a binder resin (C);
wherein the ink has a viscosity at a shear rate of 10 (1/s) and 25° C. of 60 Pa·s or more;
wherein the ink has a TI value, viscosity at a shear rate of 10 (1/s)/viscosity at a shear rate of 100 (1/s), at 25° C. of 3.0 to 5.6;
wherein the surface-modified silver nanoparticles (A) each comprises a silver nanoparticle, and an amine-containing protective agent coating a surface of the silver nanoparticle; and
wherein the solvent (B) comprises a terpene solvent having a boiling point of 200° C. or more and a glycol ether solvent having a boiling point of 130° C. or more, and a content of solvents having a boiling point of less than 130° C., in the solvent (B), being 1.0 wt % or more and 8 wt % or less based on the total amount of solvents.

22. An ink comprising surface-modified silver nanoparticles (A), a solvent (B), and a binder resin (C);
  wherein the ink has a viscosity at a shear rate of 10 (1/s) and 25° C. of 60 Pa·s or more;
  wherein the ink has a TI value, viscosity at a shear rate of 10 (1/s)/viscosity at a shear rate of 100 (1/s), at 25° C. of 3.0 to 5.6;
  wherein the surface-modified silver nanoparticles (A) each comprises a silver nanoparticle, and an amine-containing protective agent coating a surface of the silver nanoparticle;
  wherein the solvent (B) comprises a terpene solvent having a boiling point of 200° C. or more and a glycol ether solvent having a boiling point of 130° C. or more, and a content of solvents having a boiling point of less than 130° C., in the solvent (B), being 20 wt % or less based on the total amount of solvents; and
  wherein a sintered body obtained by sintering the ink at 120° C. for 30 minutes has a volume resistivity of 6 μΩcm or less.

* * * * *